(12) United States Patent
Isokoski et al.

(10) Patent No.: US 6,184,494 B1
(45) Date of Patent: Feb. 6, 2001

(54) PRINTED CIRCUIT BOARD HAVING A HEATING ELEMENT AND HEATING METHOD THEREOF

(75) Inventors: Arto Isokoski; Jari Marjakangas, both of Oulu (FI)

(73) Assignee: Nokia Networks OY, Espoo (FI)

( * ) Notice: Under 35 U.S.C. 154(b), the term of this patent shall be extended for 0 days.

(21) Appl. No.: 09/478,584

(22) Filed: Jan. 6, 2000

Related U.S. Application Data

(63) Continuation of application No. PCT/FI99/00373, filed on May 4, 1999.

(30) Foreign Application Priority Data

May 8, 1998 (FI) ...................................................... 981032

(51) Int. Cl.⁷ .................................................. H05B 1/00
(52) U.S. Cl. ............................................. 219/209; 338/48
(58) Field of Search ..................................... 219/200, 201, 219/209, 210; 338/46, 48, 24, 204–205, 254, 260, 314

(56) References Cited

U.S. PATENT DOCUMENTS

| 3,440,407 | 4/1969 | Goltsos et al. . |
| 4,374,316 | 2/1983 | Inamori et al. . |
| 4,582,975 | * 4/1986 | Daughton ............................. 219/209 |
| 5,635,893 | * 6/1997 | Spraggins et al. ...................... 338/48 |

FOREIGN PATENT DOCUMENTS

| 2038102 | 7/1980 | (GB) . |
| 2300340 | 10/1996 | (GB) . |
| 98/30075 | 7/1998 | (WO) . |

OTHER PUBLICATIONS

Copy of International Search Report.
Patent Abstracts of Japan, 4–206480 A (Hitachi Chem Co Ltd), Jul. 28, 1992.
Patent Abstracts of Japan, 1–143164 A (Ibiden Co Ltd), Jun. 5 1989.

* cited by examiner

Primary Examiner—Tu Ba Hoang
(74) Attorney, Agent, or Firm—Altera Law Group, LLC

(57) ABSTRACT

The present invention relates to a heating method and a printed circuit board comprising a heating element which generates heat required to heat printed circuit board components. The printed circuit board comprises heat conductor between the heating element and the component to be heated, the heat conductor receiving heat generated by the heating element and conducting the heat along the surface of the printed circuit board beneath the lower surface of the component to be heated. Furthermore, the printed circuit board comprises conductor parts which are narrower that the heat conductor, or which have a smaller cross-sectional surface area than does the heat conductor, and which restrict heat transfer away from the heat conductor to a component other than the one to be heated when the heat conductor functions as a ground plane or a signal path.

15 Claims, 2 Drawing Sheets

PRINTED CIRCUIT BOARD HAVING A HEATING ELEMENT AND HEATING METHOD THEREOF

This application is a continuation of PCT/FI99/00373 filed May 4, 1999.

FIELD OF THE INVENTION

The invention relates to a heating method employing a heating element for generating heat required to heat printed circuit board components.

BACKGROUND OF THE INVENTION

Electrical devices are often used at a wide range of operating environment temperatures. It is essential to the operation of an electrical device that it is used in such an operating environment where temperature is not above or below the rated operating environment temperatures given to the components of the device. If the operating environment temperature of the device is lower than stated in the operating instructions of a component, the component may become damaged. If the component remains undamaged despite of the low operating environment temperature, the operation of the device may, nevertheless, become disturbed. When the device is kept switched on long enough, the temperature around the device rises because of heat produced by components of good cold resistance. This makes poorly cold resistive components of the device operate in the desired manner. The temperature of the environment may refer to the air temperature inside the case in which the device is placed.

If a component of poor cold resistance is used in an environment possibly having a very low temperature, it is necessary to heat the device so as to make it function in the desired manner. U.S. Pat. No. 3,440,407, for example, discloses a multi-layer printed circuit board having in its inner layers a heating element which heats the circuit board and the components thereon. Since the heating element is placed in the inner layers, it is extremely difficult to direct the thermal power to an individual component. If the thermal power cannot be properly directed to the desired component, the operation of the components which are not wished to be heated becomes more difficult because of the excess heat. Since the heating of the printed circuit board requires wiring to be provided in the inner layers of the circuit board, the manufacturing costs of the board become relatively high. Furthermore, it is a disadvantage of the prior art temperature-controlled printed circuit board that for the heating element, the circuit board has to be provided with through holes. Furthermore, the prior art printed circuit board is prone to electromagnetic interference.

BRIEF DESCRIPTION OF THE INVENTION

An object of the invention is thus to provide a method and equipment implementing the method so as to solve the above problems. This is achieved by a method of the type presented in the introduction, which is characterized by transferring heat generated by the heating element by way of conduction from the heating element to a heat conductor on the surface of the printed circuit board, the heat being transferred further by way of conduction along the heat conductor beneath the lower surface of the component, and when the heat conductor functions as a ground plane or a signal path, restricting heat conduction away from the heat conductor to a component other than the one to be heated by connecting the heat conductor to the ground plane or the signal path with a conductor part which is more narrow than the heat conductor, or which has a smaller cross-sectional area than does the heat conductor.

The invention also relates to a printed circuit board comprising a heating element for generating heat required to heat printed circuit board components.

The printed circuit board of the invention is characterized in that the circuit board comprises a heat conductor between the heating element and the component to be heated, the heat conductor receiving heat generated by the heating element and conducting the heat along the surface of the printed circuit board beneath the lower surface of the component to be heated, and conductor parts which are more narrow than the heat conductor, or which have a smaller cross-sectional area than does the heat conductor, and when the heat conductor functions as a ground plane or a signal path, the conductor parts restrict heat conduction from the heat conductor to a component other than the one to be heated.

The invention is based on the idea that heat generated by a heating element is conducted along a heat conductor formed on a printed circuit board to the component to be heated.

The method and printed circuit board of the invention provide many advantages. In the method, heat is conducted to the component to be heated, whereby it is possible to reduce the generation of electromagnetic interference, for example. Since the component is heated by conducting heat to the component rather than supplying extra current thereto, the risk of short cuts is reduced. Furthermore, the thermal power generated by the heating element can be kept to the minimum, because the heating effect produced by the heating element can be directed very accurately to the desired object.

The heating method of the invention is technically easy to implement on a printed circuit board. Heating does not require extra layers to be made on the circuit board, and the manufacturing costs of the board do not therefore rise significantly because of heating. The heating method enables extremely reliable standard resistors to be used as a heating element. A heat conductor can be coupled to the ground plane of the circuit board, for example, to prevent electromagnetic interference from being generated. Furthermore, to prevent heat from transferring away from the heat conductor the circuit board is provided with regions free of conductive material and with tapered conductor parts.

BRIEF DESCRIPTION OF THE DRAWINGS

In the following, the invention will be described in more detail by means of preferred embodiments with reference to the accompanying drawings, in which.

DETAILED DESCRIPTION OF THE INVENTION

Figure 1:
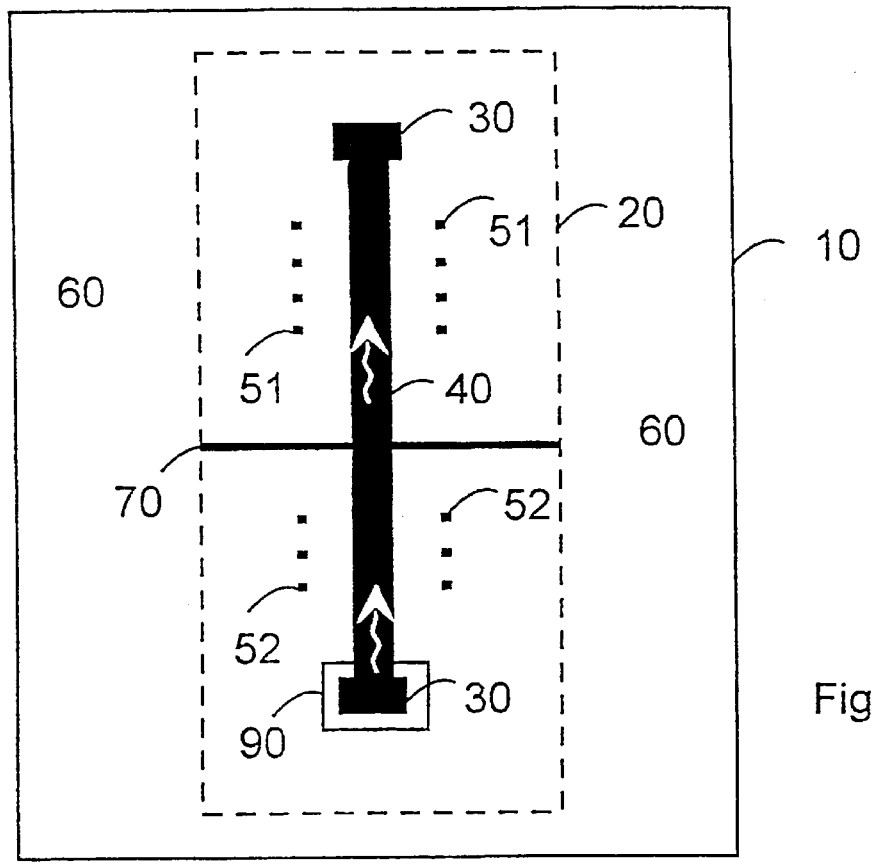
FIG. 1 shows a first printed circuit board of the invention.

FIG. 1 shows a printed circuit board 10 of the invention. Attachment points 51, 52 have been formed on the printed circuit board for component pins. Components such as integrated circuits, ASIC circuits or other electrical components can be mounted on the attachment points 51, 52. In case an integrated circuit having pins thereon is to be attached to the attachment points 51, 52, the attachment points are provided with a separate attachment point part for each pin of the integrated circuit. The figure shows that the attachment point 51 is composed of eight attachment point parts. The attachment point 52 is composed of six attachment point parts. The attachment points are typically made, for example, of copper or some other conductive material.

Furthermore, the printed circuit board comprises at least one heating element 90 heating the components attached to the attachment points 51, 52. The heating element 90 is preferably electrically operated. A SMD-type power resistor, for example, can be used as the heating element 90. The circuit board further comprises a heat conductor 40 made of well heat conductive material or of the conductor material used for the circuit board. The heat conductor 40 is preferably made simultaneously with signal conductors of the circuit board. The heat conductor 40 shown in the figure comprises at opposite ends matching points 30 practically made of the same material as the heat conductor.

The heating element 90 is preferably placed on the matching point 30. If the heating element 90 comprises a heating fin by which the heat generated by the heating element transfers away therefrom, the heating element on the circuit board is so placed that the heating fin is in contact with the matching point 30. The heat generated by the heating element then transfers by way of conduction from the heating fin to the matching point and further to the heat conductor 40. It is preferable that the surface area of the heating fin placed on the matching point is about the same as the surface area of the matching point. This provides optimum heat transfer from the heating fin to the matching point. It is possible to apply well heat conductive paste, for instance, between the junction of the heating fin and the matching point, thus providing the best possible joint for heat transfer.

The same heat conductor 40 may extend beneath a number of components. Furthermore, several heat-generating heating elements can be attached to the heat conductor 40, whereby heat can be distributed more evenly over the entire area of the heat conductor 40. By the component to be heated, the heat conductor 40 may comprise regions matched to the lower surface area of the component to be heated. This allows heat to be transferred as evenly as possible over the entire component to be heated. The above regions are preferably of the same size and shape as the lower surface area of the component.

The heat conductor 40 may be a part of the actual ground plane 60 of the printed circuit board. A difference of potential may also exist between the heat conductor and the actual ground plane of the circuit board. In FIG. 1, the ground plane of the circuit board may be composed of the section 60 between the edges of the circuit board and an area marked with a dashed line 20, for example. In practice, the section 60 on the printed circuit board is formed of the same material as the heat conductor. The printed circuit board comprises a conductor 70 connected to the heat conductor. The conductor connects the heat conductor 40 to the ground plane 60. The conductor 70 balances the potential between the heat conductor 40 and the ground plane 60, thus reducing the generation of interference. If the heat conductor is comparatively long, more than one conductors 70 can be provided. In practice, the cross-sectional area of the conductor 70 has to be smaller than that of the heat conductor 40 in order that much heat would not be transferred along the conductor 70 to the ground plane 60.

Figure 2:
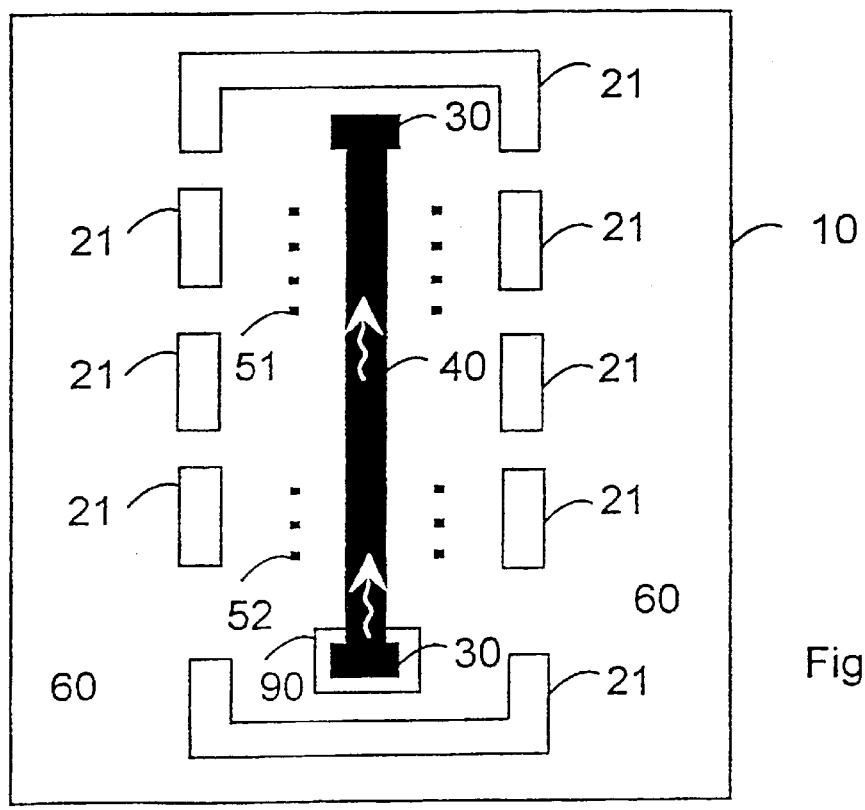
FIG. 2 shows a second embodiment of a printed circuit board of the invention.

FIG. 2 shows a second embodiment of the printed circuit board 10 of the invention. In addition to the above parts, the printed board comprises regions 21 free of conductive material. The regions 21 are located around the heat conductor 40 and the component to be heated. This restricts the transfer of heat, which flows in the heat conductor, away from the heat conductor. In other words, the regions 21 prevent heat in the heat conductor from being conducted to some other part of the printed circuit board. The attachment points 51, 52 of the component on the circuit board are insulated from the ground plane 60 of the board, if necessary.

Figure 3:
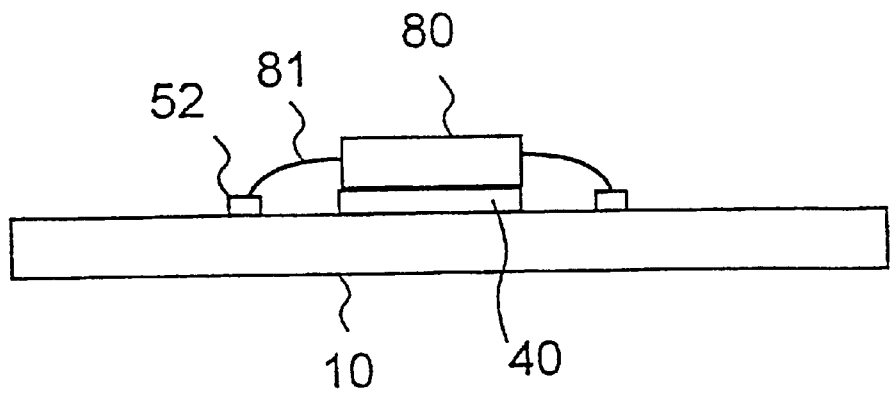
FIG. 3 shows a cross section of a printed circuit board of the invention.

FIG. 3 shows a cross-section of a printed circuit board of the invention, in which a pin 81 of a component 80 is fastened to the attachment point 52. The heat conductor 40 is so placed on the printed board that the components to be heated are as close as possible to the heat conductor. Heat is best transferred from the heat conductor 40 to the component when the component to be heated is in contact with the heat conductor. In that case, heat transfer is mainly based on heat conduction.

Heat generated by the heating element 90 can be transferred and directed to the desired component with the help of the heat conductor 40, the heat then causing as little trouble as possible to other component of the circuit board. The heating element 90 does not necessarily generate heat continuously. For example, the heating element may generate heat only when the temperature inside the casing of a device, for example, reaches a given temperature. The heating element 90 may also generate heat only when the device is switched on at low environment temperatures. The heating element 90 stops generating heat when the device and particularly its cold-sensitive components reach a temperature at which the components are capable of operating in the normal manner, at least as far as temperature is concerned.

Figure 4:
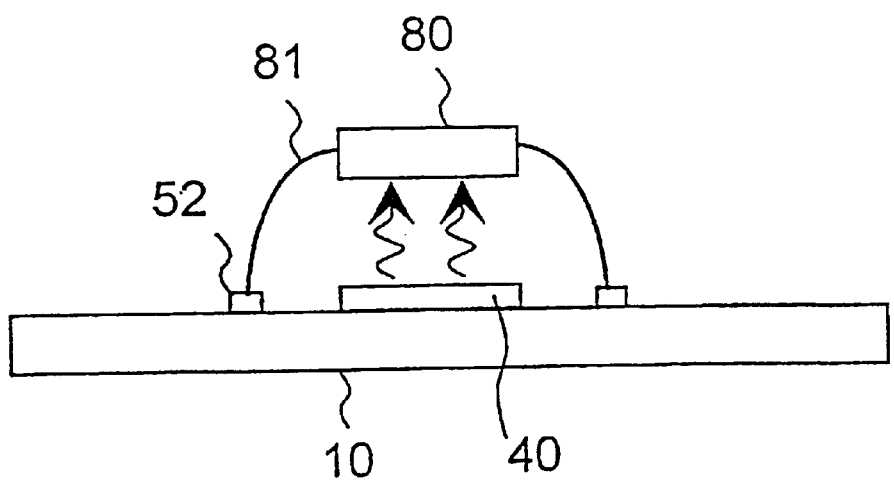
FIG. 4 shows a second embodiment of a cross section of a printed circuit board of the invention.

FIG. 4 also shows a cross-section of a printed circuit board of the invention. Herein, a gap exists between the heating conductor 40 and the lower surface of the component 80 to be heated. The gap between the heat conductor and the component to be heated can be filled, for example, with well heat conductive paste or some other material, in which case the heat conductor 40 and the component need not directly be in contact with each other. The heat conductor 40 shown in FIG. 4 is placed so far below the component 80 to be heated that the heat is transferred to the component mainly by radiation.

Figure 5:
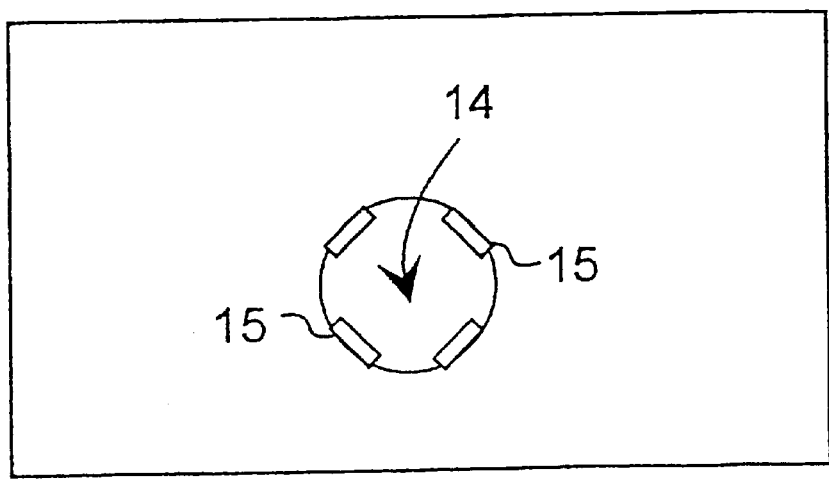
FIG. 5 shows a through hole of a printed circuit board.

FIG. 5 shows a through hole 14 on a printed circuit board, enabling a signal path to be connected to signal paths inside the inner layers of the circuit board, for example. The lead-through enables the ground plane, for example, to be connected to the ground plane of the inner layers of the circuit board. The lead-through is done by forming conductor parts 15. The solution of the figure comprises four conductor parts. The conductor parts are made of a well electrically conductive material.

The conductor parts are placed in the hole in such a way that different conductor parts 15 in the hole are not in contact with one another, whereby it is possible to reduce heat transfer through the through hole. If the combined width of the conductor parts 15 in the through hole is smaller than the width of the heat conductor, and if the conductor parts are arranged far enough from one another, they do not touch one another even though tin would be soldered on them during soldering. Heat transfer is also prevented if the cross-sectional area of the conductor parts is small as compared with the cross-sectional area of the heat conductor 40.

Although the invention is described above with reference to the example according to the accompanying drawings, it will be obvious that the invention is not restricted thereto, but it can be modified in many ways within the scope and spirit of the inventive idea disclosed in the attached claims.

What is claimed is:

1. A heating method employing a heating element for generating heat required to heat components of a printed circuit board, the heating method comprising:

transferring heat generated by the heating element by way of conduction from the heating element to a heat conductor on the surface of the printed circuit board, the heat being transferred further by way of conduction along the heat conductor beneath the lower surface of the component, and restricting heat conduction away from the heat conductor to a component other than the one to be heated by connecting the heat conductor to a ground plane or a signal path with a conductor part which is narrower than the heat conductor, or which has a smaller cross-sectional area than does the heat conductor.

2. A method as claimed in claim 1, wherein transferring the heat between the lower surface of the component to be heated and the printed circuit board by way of conduction.

3. A method as claimed in claim 1, wherein transferring the heat generated by the heating element to a metal foil attached on the surface of the printed circuit board, and the heat is conducted by the metal foil to the component to be heated.

4. A method as claimed in claim 1, wherein heating the heat conductor by at least one heating element which is placed at either end of the heat conductor.

5. A method as claimed in claim 1, wherein conducting heat by means of a conductive material placed between the component to be heated and the printed circuit board from the heat conductor to the component to be heated.

6. A method as claimed in claim 1, wherein restricting heat transfer from the heat conductor through a through hole in the printed circuit board to inner layers of the printed circuit board by forming in the inner surface of the through hole conductor parts arranged apart from one another.

7. A method as claimed in claim 1, wherein restricting heat transfer through a through hole to an inner layers of the printed circuit board by forming at least one conductor part whose width or cross-sectional area is smaller than the width or cross-sectional area of the heat conductor.

8. A method as claimed in claim 1, wherein forming regions around the component to be heated and the heat conductor, which regions are free of heat conductive material.

9. A printed circuit board comprising a heating element for generating heat required to heat printed circuit board components, the printed circuit board comprises:

a heat conductor between the heating element and the component to be heated, the heat conductor receiving heat generated by the heating element and conducting the heat along the surface of the printed circuit board beneath the lower surface of the component to be heated, and conductor parts which are narrower than the heat conductor, or which have a smaller cross-sectional area than does the heat conductor, and the conductor parts restrict heat conduction from the heat conductor to a component other than the one to be heated.

10. A printed circuit board as claimed in claim 9, wherein the heat conductor is a metal foil attached on the surface of the printed circuit board.

11. A printed circuit board as claimed in claim 9, wherein when the heating element is a heating resistor comprising a heating fin, the heating fin is attached to the heat conductor.

12. A printed circuit board as claimed in claim 9, wherein the printed circuit board comprises at least one heating element transferring heat to an end of the heat conductor.

13. A printed circuit board as claimed in claim 9, wherein the printed circuit board comprises a heat conductive material between the component to be heated and the heat conductor.

14. A printed circuit board as claimed in claim 9, wherein the conductor parts restricting heat conduction are arranged in through holes of the printed circuit board.

15. A printed circuit board as claimed in claim 9, wherein the printed circuit board comprises through holes, and the conductor parts arranged apart from one another are attached to the inner layer of the through holes.

* * * * *